US009502799B2

(12) United States Patent
Garcia et al.

(10) Patent No.: US 9,502,799 B2
(45) Date of Patent: Nov. 22, 2016

(54) CONNECTOR DEVICE

(71) Applicant: MOTOROLA SOLUTIONS, INC, Schaumburg, IL (US)

(72) Inventors: Jorge L. Garcia, Plantation, FL (US); Richard K. Schmid, Sunrise, FL (US); Anthony J. Suppelsa, Parkland, FL (US)

(73) Assignee: MOTOROLA SOLUTIONS, INC., Chicago, IL (US)

( * ) Notice: Subject to any disclaimer, the term of this patent is extended or adjusted under 35 U.S.C. 154(b) by 0 days.

(21) Appl. No.: 14/523,393

(22) Filed: Oct. 24, 2014

(65) Prior Publication Data

US 2016/0118732 A1 Apr. 28, 2016

(51) Int. Cl.

*H01R 12/00* (2006.01)
*H05K 1/00* (2006.01)
*H01R 12/72* (2011.01)

(52) U.S. Cl.

CPC .......... *H01R 12/724* (2013.01); *H01R 12/721* (2013.01)

(58) Field of Classification Search

CPC H01R 12/7076; H01R 12/70; H01R 12/724; H01R 12/721; H01R 13/2471; H01R 13/24; H01R 24/68
USPC .................................................. 439/83, 629
See application file for complete search history.

(56) References Cited

U.S. PATENT DOCUMENTS

| | | | | |
|---|---|---|---|---|
| 4,053,199 | A * | 10/1977 | Hollyday | H01R 23/72 439/55 |
| 4,867,691 | A | 9/1989 | Eck | |
| 5,178,562 | A | 1/1993 | Ermini | |
| 5,199,884 | A | 4/1993 | Kaufman et al. | |
| 6,022,226 | A | 2/2000 | Lyford et al. | |
| 6,358,067 | B1 | 3/2002 | Takase et al. | |
| 7,399,188 | B1 | 7/2008 | Shen et al. | |
| 8,052,470 | B1 | 11/2011 | Lin | |
| 2013/0189878 | A1 | 7/2013 | Lan et al. | |

* cited by examiner

*Primary Examiner* — Javaid Nasri
(74) *Attorney, Agent, or Firm* — Barbara R. Doutre

(57) ABSTRACT

A connector (200) provides improved robustness and strength with a header (202) configured to retain and expose a plurality of receptacles (204). The exposed portion of each receptacle provides a surface mount solderable element as part of the overall connector. Another embodiment further provides a lead (208) extending from the exposed portion of the receptacle to provide an additional leaded solderable element to the connector. Thus, the connector can provide both surface mount capability and/or a combination of surface mount and lead mount capability. The exposed portions of the receptacles may be soldered flush to a board (302), thus minimizing z-height of the connector to the board and allowing for a larger sized diameter receptacle.

14 Claims, 6 Drawing Sheets

402

404

406

CONNECTOR DEVICE

FIELD OF THE DISCLOSURE

The present disclosure relates generally to connectors and more particularly to surface mount pin and socket connectors for mounting to a board.

BACKGROUND

Pin and socket connectors offer a superior electrical interconnect for high current applications and robustness against intermittence, making these types of connectors well suited for power applications, such as radio power applications. Both leaded and surface mount technology (SMT) versions of these connectors are available as off-the shelf parts. Unfortunately, typical off-the-shelf, board mounted pin and socket connectors, particular those with 90 degree leads, have many disadvantages. For example, the leaded version of these connectors can easily lift up and fracture at the leads, and the SMT version can easily lift up and fracture at the solder joints.

FIG. 1 shows a typical prior art 90 degree SMT board mounted connector 100. As seen in a first view 120, connector 102 is not sitting flush on board 104 causing gaps 106 to be formed between the connector and the board. These gaps 106 can result in strain and misalignment of pin 114. As seen in a second view 130, the connector 102 has lifted up at 116 from the board 104 which causes strain on the leads 118 and potential breakage.

Connector 102 comprises a header 108 for encasing receptacles 112 in header plastic. The header 108 has a high z-axis profile 110 (for example a z-axis of 2.54 mm) which limits the size available for accepting a pin 114. For a connector having a z-axis profile of 2.54 mm the pin diameter may be limited to, for example, a diameter of only 0.5 mm. The strength of such connectors is not suitable for certain applications, such as radio power applications.

Accordingly, there is a need for a more robust connector that minimizes the overall height of the connector from the board while allowing for a maximized receptacle diameter.

BRIEF DESCRIPTION OF THE FIGURES

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
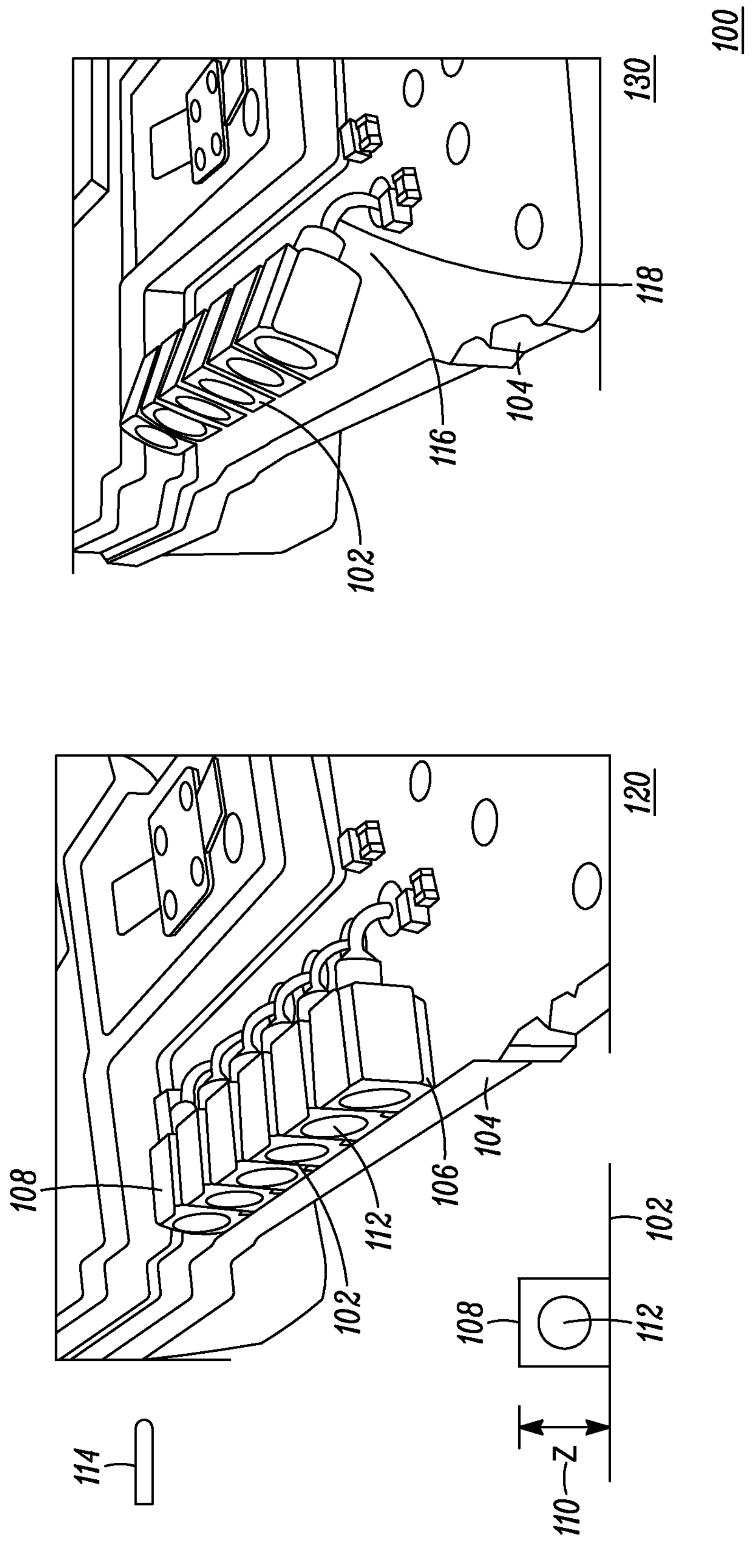
(PRIOR ART) FIG. 1
FIG. 1 is prior art connector.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION

Briefly, the problems associated with current off-the-shelf surface connectors for pin and socket type applications are resolved by the elements described herein. A connector having a header for retaining a conductive receptacle is provided, the receptacle for receiving a pin(s) as part of an electronic interconnect. In accordance with the various embodiments, the header is configured to expose a portion of the receptacle while encasing a non-exposed portion of the receptacle. The exposed portion of the receptacle provides a surface mount solderable element as part of the overall connector. Another embodiment further provides a lead extending from the receptacle to provide an additional leaded solderable element to the connector. Thus, the connector can provide both surface mount and lead mount capability.

The connector configuration minimizes overall z-axis height while allowing for a maximized receptacle diameter. The connector when incorporated as part of a board mounted connector assembly further provides for a surface mount interconnect that sits flush with a board. The connector, as part of another board mounted connector assembly, further provides improved robustness through a combination of surface mount and leaded solderability.

Figure 2:
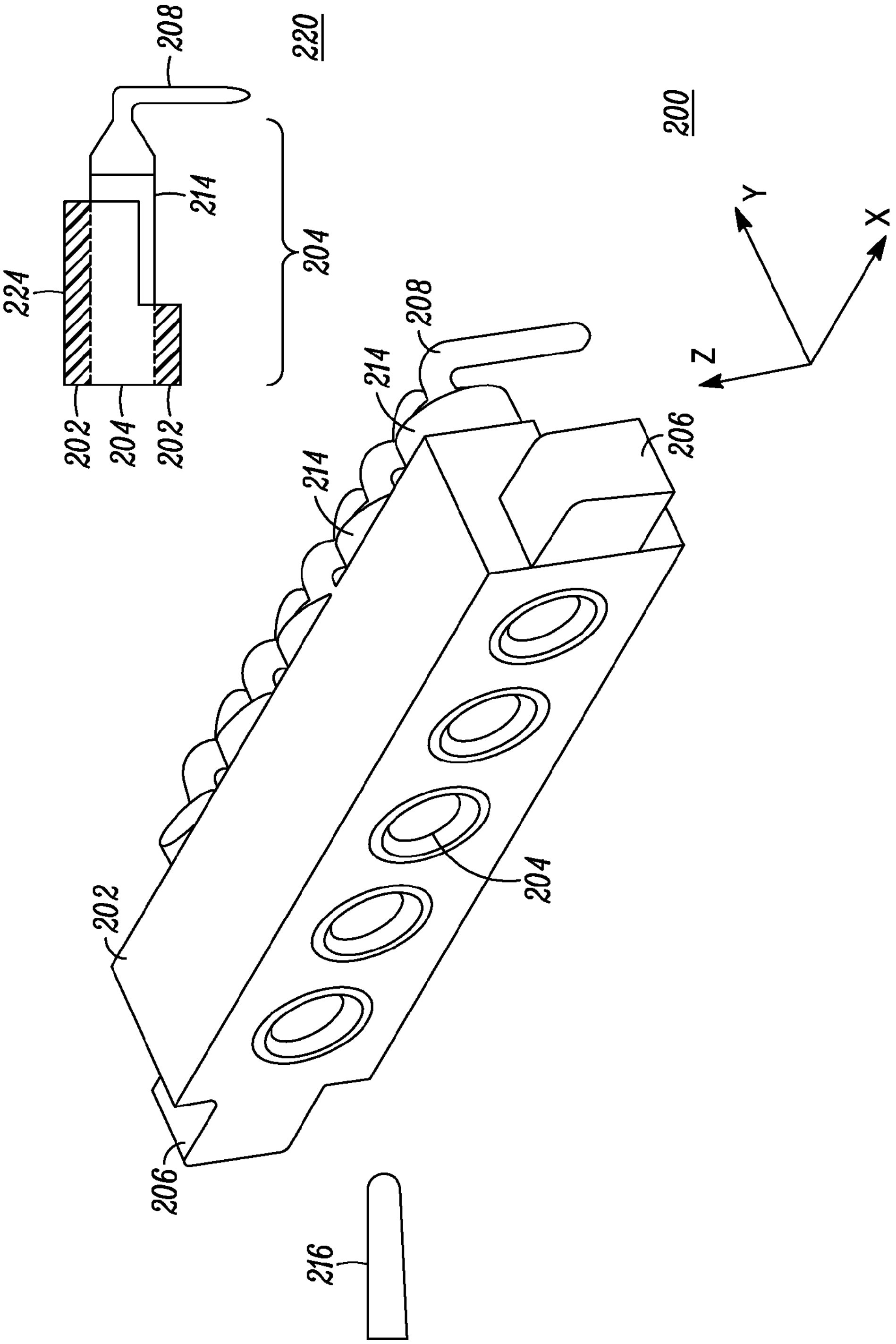
FIG. 2 is a connector formed in accordance with an embodiment.

FIG. 2 is a connector 200 in accordance with an embodiment. Connector 200 comprises a header 202 having a plurality of receptacles 204 formed therein and alignment tabs 206 extending therefrom. Each receptacle 204 provides a conductive socket interconnect for receiving a pin 216, as part of a pin and socket interconnect. The header 202 may be formed of a plastic material or other rigid, non-conductive material resistant to high temperatures used in board mounting and reflow technologies. In accordance with the various embodiments, a first portion of each receptacle 204 is partially encased within the header 202, while a second portion 214 of each receptacle 204 is exposed outside of the header 202. The receptacle 204 may also be referred to as a barrel. Referring to cross sectional view 220, the header 202 is formed of a singled piece part and may be formed as an L-shape 224 cross section. A first portion of each receptacle 204 encased within the header 202 may be referred to as a non-exposed barrel portion or a non-exposed receptacle portion. The second portion 214 of each receptacle 204 exposed outside of the header 202 may be referred to as an exposed barrel portion 214 or an exposed receptacle portion 214. In accordance with the various embodiments, the exposed barrel portion 214 provides a surface mount solderable element for connector 200.

In the embodiment of FIG. 2, the exposed barrel portion 214 has a lead 208 extending therefrom. In accordance with this embodiment, connector 200 provides two solderable elements for each receptacle 204: a surface mount solderable element provided by the exposed receptacle portion 214 and a leaded solderable element provided by lead 208.

The leads 208 are shown bent 90 degrees relative to the exposed barrel portion 214, however, straight leads, other angled leads, or no leads could be used depending on the application. For example straight leads could be soldered to another surface. Alignment tabs 206 provide alignment in the z-axis direction for mounting to a board. In some embodiments, the header 202 may be removable from the connector 200. Thus, the header 202 may be used for alignment of the receptacles to a board and/or for additional reinforcement of the overall connector 200.

Referring to an x-y-z orientation, each individual receptacle 204 has an opening parallel to the y-axis. Receptacles are arranged in the x-axis. In this embodiment, the leads 208 are bent along the z-axis. While the L-shaped header 202 is preferred, other configurations of the header which allow for the exposure of part of the receptacle sufficient to provide a solderable element may also be contemplated. The ability to have the receptacle 204 becoming part of the mounting apparatus of the connector 200 improves the strength of the overall part when mounted to a board as will be shown next.

Figure 3:
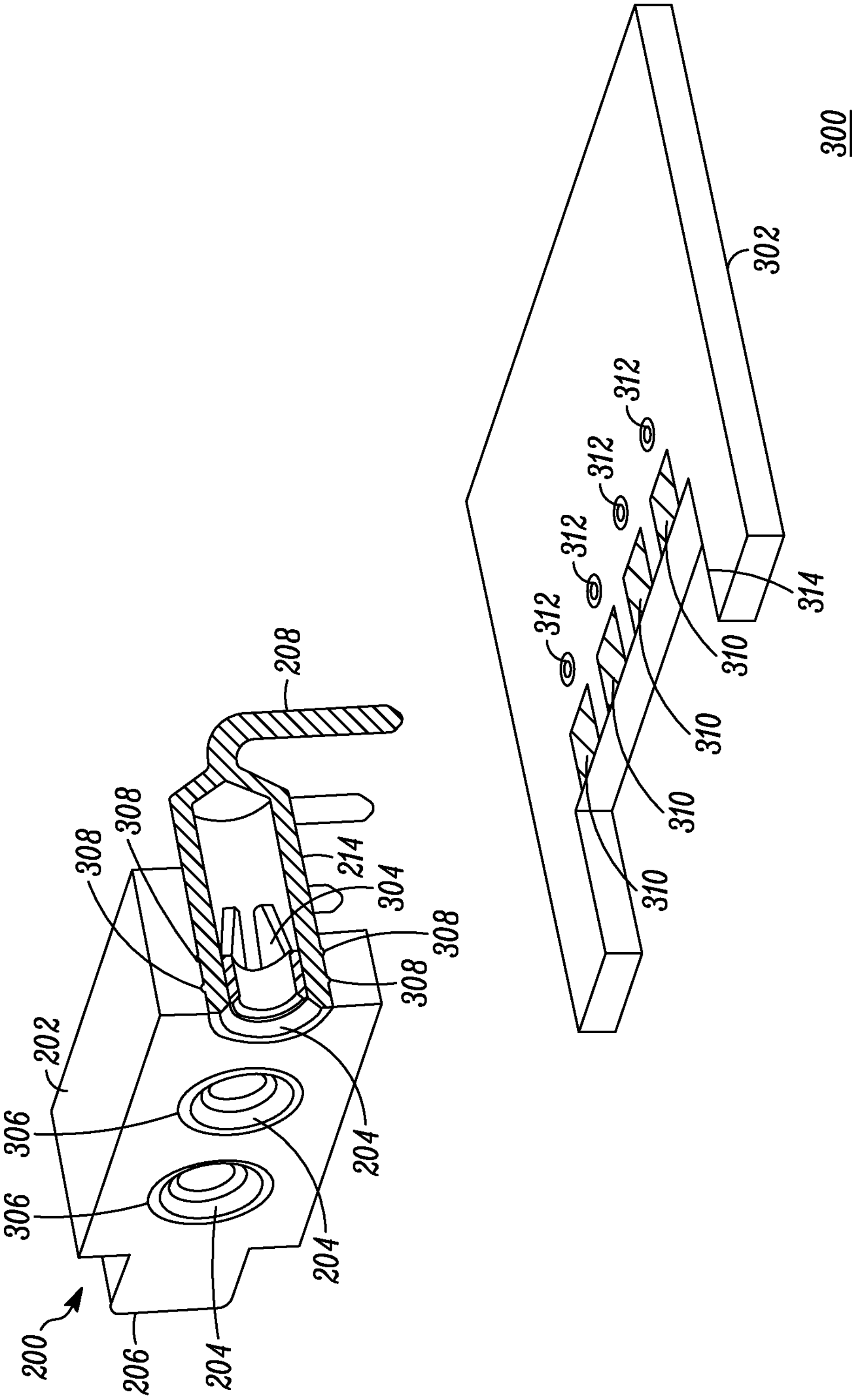
FIG. 3 shows a partial cut-away view of the connector of FIG. 2 and a board upon which the connector can be mounted as part of a board mounted connector assembly in accordance with an embodiment.

FIG. 3 shows a partial cut-away view of the connector 200 of FIG. 2 and a board 302 upon which the connector can be mounted as part of a board mounted connector assembly 300 in accordance with an embodiment. As seen in the cut-away view of connector 200, the plurality of receptacles 204 each comprise spring loaded sockets 304 for pin retention. Each receptacle 204 is press fit into openings 306 of the header 202 and retained by ribs 308 on the receptacle and corresponding grooves in the header 202. Other retaining means can also be used to hold the receptacles 204 within the header 202. If the header 202 is to be a removable header then the retaining grooves can be eliminated. Once inserted into the header 202, the leads 208 can be bent to the desired degree, in this case shown as 90 degrees.

The alignment tabs 206 are used to align the header 202 upon the board 302 such the exposed barrel portion 214 of each receptacle 204 is aligned with a respective solder pad 310. Board 302 comprises a plurality of solder pads 310 upon which the exposed barrel portion 214 of each receptacle 204 can be soldered. The connector header 202 has been shaped to allow a sufficient amount of the exposed barrel portion 214 to sit flush on the board 302 for soldering. Board 302 further comprises a plurality of through-hole vias 312 within which each of the connector leads 208 can be soldered. In accordance with the board mounted embodiment, board 302 comprises a board edge cut-out 314 providing space for the header 202 to be off the board 302 while z-alignment tabs 206 are mounted flush to the board. The alignment tabs 206 support the connector 200 on either side of the cut-out 314. Thus, the receptacles 204 of connector 200 are positioned lower than the receptacles 112 of the prior art, thereby advantageously allowing the exposed barrel portions 214 to be soldered directly to the board 302.

In accordance with the various embodiments, the header 202 being formed of a housing that exposes a portion of the receptacle 204 for soldering is extremely advantageous. The exposed barrel portion 214 provides a surface mount element to secure the connector 200 to the board 302 at solder pads 310. The board edge cut-out 314 accommodates each receptacle 204 portion which is wrapped in plastic. Alignment tabs 206 on the edge of the header 202 are used to hold the exposed receptacle portion 214 flush to the board 302 prior to solder.

Figure 4:
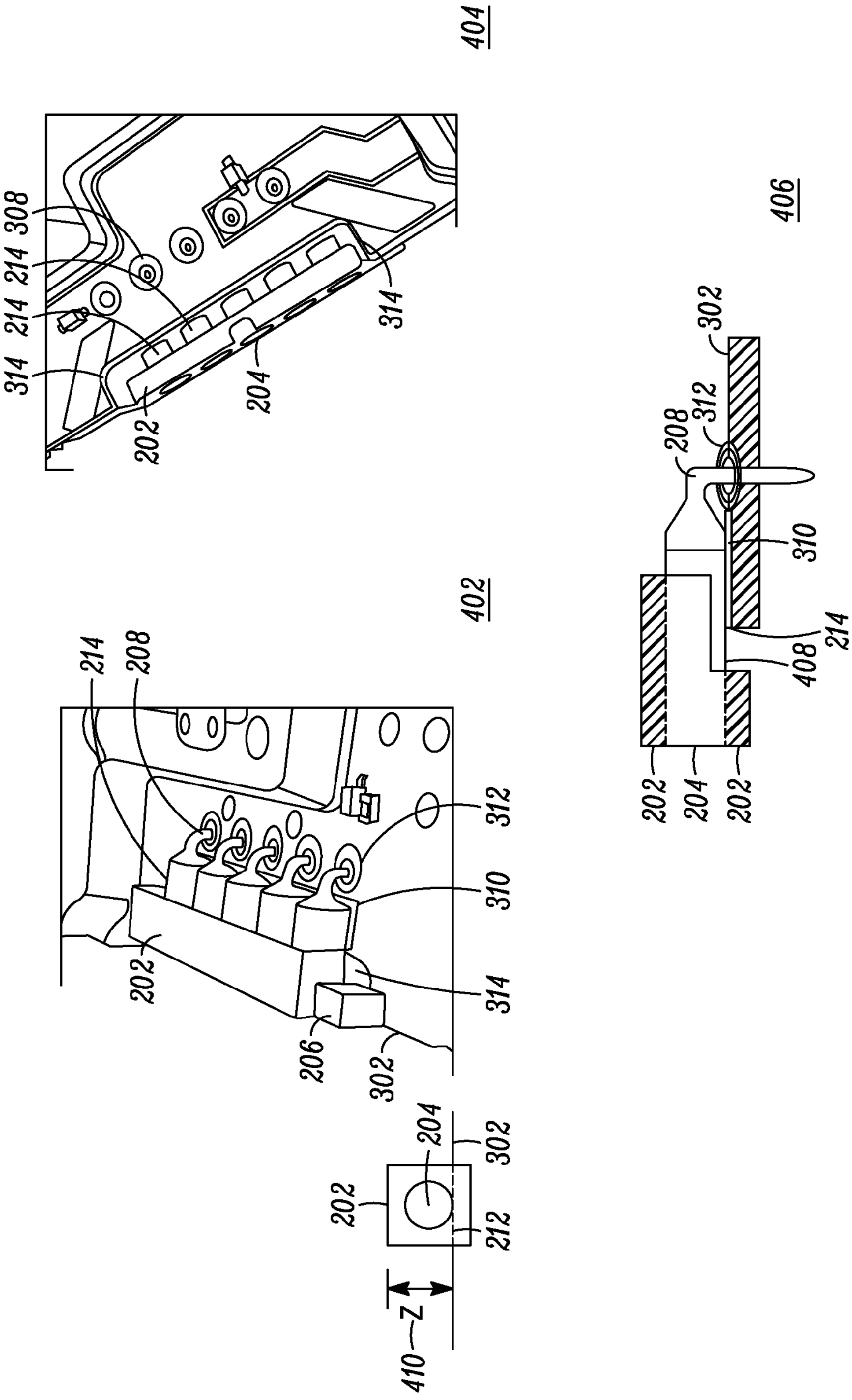
FIG. 4 shows the connector of FIG. 2 coupled to the board of FIG. 3 in accordance with a board mounted connector embodiment.

FIG. 4 shows the connector 200 coupled to the board 302 in accordance with a board mounted connector embodiment. View 402 shows a top view of the board 302 and connector 200, view 404 shows a bottom view of the board and connector, and view 406 shows a partial cut-away view of the connector soldered to the board indicating the exposed and non-exposed regions of the receptacle 204.

As seen in view 402, in accordance with this board mounted embodiment, alignment tabs 206 align the header 202 across the cut-out 314 on the board 302 such that a sufficient amount of the exposed barrel portion 214 of each receptacle 204 is seated on its respective solder pad 310. As further seen in view 402, each of the connector leads 208 is soldered to each of plurality of through-hole vias 312.

As seen in view 404, the board edge cut-out 314 accommodates each non-exposed receptacle portion (i.e. the portion wrapped in plastic) as well as a non-soldered, exposed barrel portion 214 which sits off the edge of the board. The non-exposed portion of the header (the plastic portion) being positioned within the cut-out 314 of the board 302. Thus, the plastic header 202 can be a removable piece-part which may be desirable for some applications.

As seen in view 406, part of the exposed barrel portion 214 which overhangs the board 302 is seen at tolerance spacing 408—located between the base of the header 202 plastic housing and the edge of the board 302. The connector header 202 has been shaped to allow a sufficient amount of the exposed barrel portion 214 of the receptacle 204 to sit flush on the board 302 for surface mount attachment.

Referring back to view 402, the use of exposed and non-exposed portions of the receptacle 204 advantageously allows the diameter of the receptacle to be maximized (to accommodate larger pins) even with a lower profile z-height 410. The z-axis height 410 is measured from board 302 to top surface of the header 202 and this height can be made lower than that of prior art headers. The diameter of the receptacles 204 can be made larger than prior art receptacles because a portion of the header 202 is able to sit beneath the board 302 within the cut-out 314. For example the connector 200, formed in accordance with the various embodiments, can accommodate a 0.8 mm diameter pin with a height profile that does not exceed the 2.54 mm. These dimensions are merely provided as an example as other height and diameter configurations are possible dependent on the application.

The plastic header 202 of the connector 200 being generally shaped as an L-shape (side view) as seen in view 406 exposes the sides of the receptacle for soldering. The board edge cut-out 314 allows the plastic of the header 202 to enclose a sufficient amount of the receptacle 204 in a single header that still provides proper alignment and robustness. Hence, the connector 200 advantageously provides improved anchoring, can accommodate larger pin diameters with a low profile (z height 410). Other header proportions or shaping are contemplated, however the shaping and proportions should provide for a sufficient amount of the receptacle 204 to be exposed for soldering purposes while still providing appropriate support and robustness for the overall interconnect with lower z-height and capability of maximized diameter of the receptacle.

Figure 5:
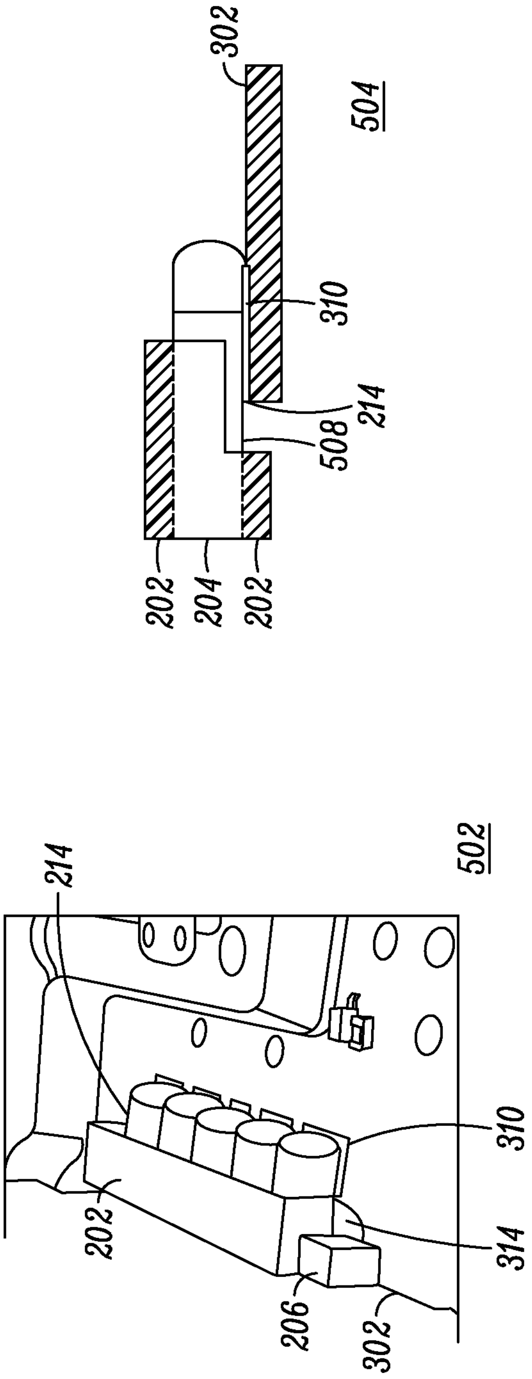
FIG. 5 shows the connector of FIG. 2 (without leads) soldered to a board in accordance with another embodiment.

While the leads 208 provide additional robustness, there may be applications where the surface mount solderability of the connector 200 may be sufficient. FIG. 5 shows the connector 200 soldered to board 302 at solder pads 310 (without the leads 208) in accordance with another embodiment. The board edge cut-out 314 accommodates the connector header 202 in the same manner as previously described and the alignment tabs 206 ensure proper alignment prior to soldering. View 504 shows a partial cut-away view of the receptacle 204 having a portion of exposed receptacle portion 214 soldered to board 302. Since the plastic header 202 is located within the cut-out region 314 (i.e. off of the board), the plastic header can be a removable piece-part, if desired, once the receptacles are soldered down. As mentioned previously, the retention features of the header 202, such as grooves shown in FIG. 3, can be eliminated for the removable header embodiment.

Figure 6:
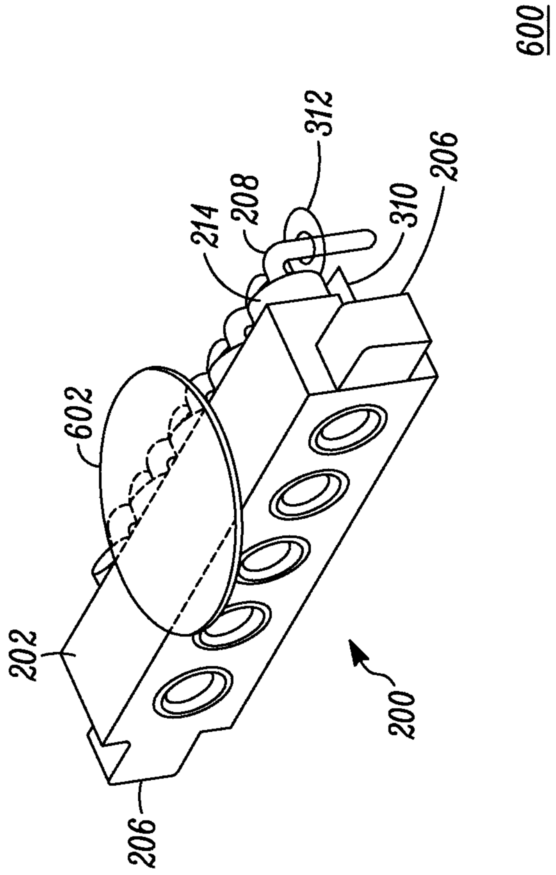
FIG. 6 shows the addition of a pick-and-place feature added to the connector in accordance with another embodiment.

FIG. 6 shows the addition of a pick-and-place element 602 added to the connector 200 in accordance with another embodiment. View 600 shows connector 200 with the addition of a pick-and-lace element 604 to facilitate automated robotic mounting of the connector 200 to a board. The mounting elements of this embodiment comprise the header 202, the alignment tabs 206 (of the header), the solder pads 310 and the through-hole vias 312 (of the board 302-shown in other views). Leads 208 may be attached to some, none or all of the exposed barrel portions 214, depending on the application.

Accordingly, the various embodiments have described a connector providing for an improved electro-mechanical interconnect. The connector comprises a header retaining a plurality of receptacles, the plurality of receptacles advantageously further operate as a plurality of surface mount elements for mounting to a board. The embodiments of FIGS. 1-6 provide a connector comprising header for retaining a receptacle in such a manner as to have an exposed portion and a non-exposed portion. The exposed portion of the receptacle provides a surface mount solderable element which can be mounted flush to a board. Further embodiments included a surface mount and leaded combination for additional robustness. Thus, the connector can provide both surface mount capability and/or a combination of surface mount and lead mount capability. All embodiments of the connector, when mounted to board, advantageously avoid lifting, reduce fractures, provide a lower –z-height profile, and accommodate a larger pin diameter. All of these advantages provide for a more robust connector, well suited for a wide variety of applications, for example high power amplifier two-way radio applications.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:

1. A connector, comprising:

a header for retaining and partially encasing a conductive receptacle, the conductive receptacle having an exposed barrel portion and a non-exposed barrel portion within the header, the exposed barrel portion providing a flush mountable solderable element for direct board edge mounting.

2. The connector of claim 1, wherein the conductive receptacle further comprises a lead extending from the exposed barrel portion, the lead being a solderable lead.

3. The connector of claim 2, wherein the connector provides both lead mounted capability and surface mount capability.

4. The connector of claim 1, wherein the header is generally configured as an L-shaped header.

5. The connector of claim 1, wherein the header is removable from the conductive receptacle.

6. The connector of claim 1, further comprising a pick-and-place feature coupled to the header.

7. The connector of claim 1, wherein the conductive receptacle has a predetermined diameter.

8. The connector of claim 1, wherein the header comprises alignments tabs for z-axis alignment.

9. The connector of claim 1, a part of the exposed barrel portion overhangs the board between a base of the header and an edge of the board thereby providing tolerance spacing.

10. A connector, comprising:

a header for retaining and partially encasing a plurality of conductive receptacles, each of the conductive receptacles having an exposed receptacle portion and a non-exposed receptacle portion within the header, each exposed receptacle portion of the header providing a flush mountable solderable element for edge mounting to a board, the header thereby providing a plurality of flush and edge mountable solderable elements for edge mounting to a board.

11. The connector of claim 10, further comprising:

a plurality of leaded elements coupled to one or more of the plurality of conductive receptacles.

12. The connector of claim 11, wherein the plurality of leaded mount elements provide lead mount capability, and the plurality of surface mount elements provide surface mount capability.

13. The connector of claim 10, wherein the plurality of conductive receptacles are for receiving pins.

14. The connector of claim 10, wherein for each of the plurality of conductive receptacles, a part of the exposed barrel portion overhangs the board between a base of the header and an edge of the board thereby providing tolerance spacing.

* * * * *